(12) United States Patent
Hao et al.

(10) Patent No.: US 6,444,550 B1
(45) Date of Patent: Sep. 3, 2002

(54) LASER TAILORING RETROGRADE CHANNEL PROFILE IN SURFACES

(75) Inventors: Ming-Yin Hao; Emi Ishida, both of Sunnyvale, CA (US)

(73) Assignee: Advanced Micro Devices, Inc., Sunnyvale, CA (US)

(*) Notice: Subject to any disclaimer, the term of this patent is extended or adjusted under 35 U.S.C. 154(b) by 9 days.

(21) Appl. No.: 09/640,177

(22) Filed: Aug. 17, 2000

Related U.S. Application Data

(60) Provisional application No. 60/149,432, filed on Aug. 18, 1999.

(51) Int. Cl.⁷ .......................................... H01L 21/425
(52) U.S. Cl. ................. 438/530; 438/535; 438/799; 438/914
(58) Field of Search ................. 438/217, 308, 438/795, 530, 514, 510, 527, 535, 799, 914; 117/53

(56) References Cited

U.S. PATENT DOCUMENTS 5,565,377 A * 10/1996 Weiner et al. ............... 438/535
5,792,699 A    8/1998 Bing-Yue Tsui
6,245,649 B1 * 6/2001 Buller et al. ................ 438/514

* cited by examiner

*Primary Examiner*—Keith Christianson
*Assistant Examiner*—Yennhu B. Huynh

(57) ABSTRACT

A semiconductor device having a retrograde channel profile is achieved by forming a retrograde impurity region in the surface portion of a semiconductor substrate, and subsequently forming a semiconductor layer on the retrograde impurity region at a predetermined thickness. The thickness of the semiconductor layer is controlled to localize the retrograde impurity region and its impurity concentration peak at a predetermined depth, thereby reducing the device's susceptibility to "reverse short channel effects."

12 Claims, 3 Drawing Sheets

LASER TAILORING RETROGRADE CHANNEL PROFILE IN SURFACES

RELATED APPLICATIONS

This application claims priority from Provisional Application Serial No. 60/149,432 filed on Aug. 18, 1999 entitled: "LASER TAILORING RETROGRADE CHANNEL PROFILE", the entire disclosure of which is hereby incorporated by reference herein.

FIELD OF THE INVENTION

The present invention generally relates to a semiconductor device comprising transistors and to a method of manufacturing the semiconductor device. The present invention has particular applicability in manufacturing a high density Metal Oxide Semiconductor Field Effect Transistor (MOSFET).

BACKGROUND ART

Over the last few decades, the electronics industry has undergone a revolutionary decrease in the size of device elements formed in integrated circuits (IC). Efforts have contributed to increasing the density of circuit elements and device performance. A large variety of semiconductor devices have been manufactured having various applications in numerous disciplines. Currently, the most common and important semiconductor technology presently used is silicon-based, and the most preferred silicon based semiconductor device is a metal-oxide-semiconductor (MOS) transistor.

The principal elements of a typical MOS semiconductor generally comprise a semiconductor substrate on which a gate electrode is disposed. The gate electrode is typically a heavily doped conductor having uniform conductivity. An input signal is typically applied to the gate electrode via a gate terminal. Heavily doped active regions, e.g., source/drain regions, are formed in the semiconductor substrate and are connected to source/drain terminals. The typical MOS transistor is symmetrical, which means that the source and drain are interchangeable. Whether an active region acts as a source or drain depends on the respective applied voltages and the type of device being made, e.g., PMOS or NMOS. A channel region is formed in the semiconductor substrate beneath the gate electrode and separates the source/drain regions. The channel region is typically lightly doped with an impurity type opposite to that of the source/drain regions, and the impurity concentration profile is substantially uniform from the surface into the substrate, as shown by line A in FIG. 2. The gate electrode is generally separated from the semiconductor substrate by an insulating layer, e.g., an oxide layer, to prevent current from flowing between the gate electrode and the source/drain regions or channel regions.

In conventional manufacturing technologies, a channel implantation process is frequently performed to augment the substrate doping of the same conductivity. Thus, for an NMOS device, a p-type impurity is ion implanted into the substrate and channel region, and for a PMOS device, an n-type impurity is ion implanted into the substrate and channel region. The purpose of this channel implant is typically to adjust a threshold voltage and limit "punch-through". The threshold voltage is the minimum required voltage applied to the gate electrode of a MOSFET device so as to invert the conductivity of the surface of the semiconductor substrate, forming a conduction channel that is of the same conductivity type as the source and drain regions. As shown by curve A in FIG. 1, as the device size shrinks, the channel length decreases and, after some point, the threshold voltage starts to decrease appreciably with the channel length. The decrease of the threshold voltage with the channel length is theoretically predicted, and this phenomenon is known as the "short channel effect (SCE)".

Contrary to what is normally expected in modern technologies, it has been observed that a threshold voltage initially increases with decreasing channel length before the threshold voltage eventually decreases rather sharply, as shown by curve B in FIG. 1. This phenomenon has been termed "reverse short channel effect (RSCE)" or "threshold voltage roll-off". Rafferty et al. (IEDM Tech. Dig., pp. 311, 1993) proposed that RSCE is a result of the transient enhanced diffusion of the channel profile induced by source/drain implantation. They explained that the damage caused by source/drain implantation generates silicon self-interstitials which flow outward and then recombine (annihilated) at the silicon surface under the gate oxide, thereby giving rise to a flux of the channel implant impurity toward the surface and raising the surface concentration of the channel impurity leading to RSCE. It has been experimentally discovered that RSCE can be avoided by preventing the channel implant from increasing at the surface of a silicon substrate.

Many approaches have been introduced, such as a retrograde channel profile, to control or even eliminate RSCE. As shown by curve B in FIG. 2, the retrograde channel profile has an impurity concentration peak deep under the surface. As disclosed in U.S. Pat. No. 5,565,377 issued to Weiner et al., a laser doping/annealing technique has been developed to achieve a desired retrograde impurity profile. According to Weiner et al., a retrograde impurity profile is formed by introducing dopants into a silicon substrate, i.e., by ion implanting dopants, and then exposing the silicon to multiple pulses of a high intensity energy source, e.g., laser. Such a pulsed energy source melts a portion of the silicon for a short time duration, and the molten silicon regrows at a high velocity from the bulk toward the surface due to the short total thermal cycle of the pulsed laser annealing, thereby forming a retrograde impurity profile with the impurity concentration peak of the dopant species at a certain depth below the surface of the silicon substrate. The method disclosed in Weiner et al. provides a relatively efficient way to tailor a desired retrograde profile by varying the process parameters, e.g., the amount of the impurity dopant, the number of times the substrate is melted and recrystallized, the rapidity of the recrystallization rate, duration of the pulsed energy, etc. However, although such conventional methodology provides a relatively simple way to form a retrograde channel profile by a laser technique, it is still difficult to achieve a desired retrograde impurity profile, i.e., a super steep retrograde profile as shown by curve C in FIG. 2, which maintains a relatively low concentration to a certain depth and then rapidly increasing toward a relatively flat impurity concentration peak.

Therefore, there exists a need for improved and production worthy methodology which provides more flexibility to tailor a desirable "super-steep" retrograde channel profile.

DISCLOSURE OF THE INVENTION

An advantage of the present invention is an efficient, simplified and production worthy method of manufacturing a MOSFET device exhibiting reduced susceptibility to "reverse short channel effect (RSCE)".

Additional advantages and other features of the present invention will be set forth in part in the description which follows and in part will become apparent to those having ordinary skill in the art upon examination of the following description or may be learned from the practice of the present invention. The objectives and advantages of the present invention maybe realized and obtained as particularly pointed out in the appended claims.

According to the present invention, the foregoing and other advantages are achieved in part by forming a retrograde impurity implant of a first conductive type in a surface portion of a semiconductor substrate, wherein the retrograde impurity implant has an impurity concentration profile increasing from a main surface of the substrate to an impurity concentration peak at a first depth below the main surface of the substrate; laser annealing to melt a portion of the substrate and to flatten the impurity concentration peak of the retrograde impurity implant, thereby forming the retrograde impurity implant having a substantially flat impurity concentration peak at a second depth below the main surface of the substrate; and forming a semiconductor layer at a predetermined thickness on the main surface of substrate to controllably localize the flat impurity concentration peak at a predetermined depth below an upper surface of the semiconductor layer.

Another aspect of the present invention is a method of manufacturing a semiconductor device, the method comprising the steps of simultaneously laser doping and annealing a portion of a main surface of a semiconductor substrate to form a substantially flat impurity concentration peak below the main surface of the substrate; and forming a semiconductor layer at a predetermined thickness on the main surface of the substrate to controllably localize the substantially flat impurity concentration peak at a predetermined depth below an upper surface of the semiconductor layer.

Additional advantages of the present invention will become readily apparent to those skilled in the art from the following detailed description, wherein only the preferred embodiment of the present invention is shown and described, simply by way of illustrating the best mode contemplated for carrying out the present invention. As will be realized, the present invention is capable of other and different embodiments and its several details are capable of modifications in various obvious respects, all without departing from the present invention. Accordingly, the drawings and description are to be regarded as illustrative in nature and not restrictive.

DESCRIPTION OF THE INVENTION

The present invention enables the manufacture of a semiconductor device exhibiting reduced susceptibility to "reverse short channel effect" by forming a substantially flat high impurity concentration implant in the main surface portion of a semiconductor substrate by laser doping and annealing, and then forming a semiconductor layer on the main surface of the substrate, thereby forming a super-steep retrograde channel profile.

Figure 3A:
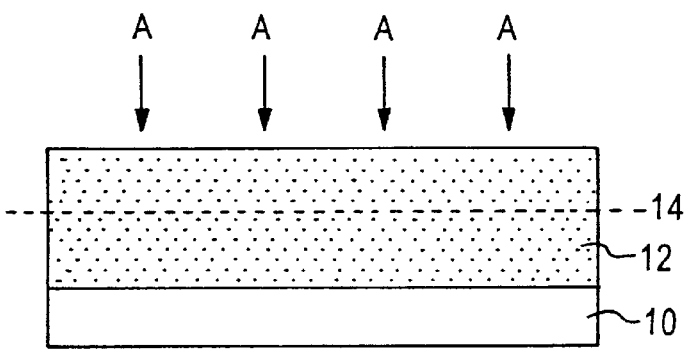
FIG. 3A to FIG. 3D illustrate sequential phase of a method according to an embodiment of the present invention, similar features being denoted by similar reference numerals.

In accordance with an embodiment of the present invention, as shown in FIG. 3A, a retrograde impurity implant 12 containing the first conductive type impurity, e.g., a P-type impurity for an NMOS device, or an N-type impurity for a PMOS device, is formed in the surface portion of a semiconductor a substrate 10, by either conventional ion implantation, diffusion or deposition techniques. In an embodiment of the present invention, an impurity is ion implanted, as shown by arrows A, into the main surface of the substrate 10, thereby forming a retrograde impurity implant 14 having an impurity concentration profile sharply increasing from the main surface to an impurity concentration peal 12.

Figure 3B:
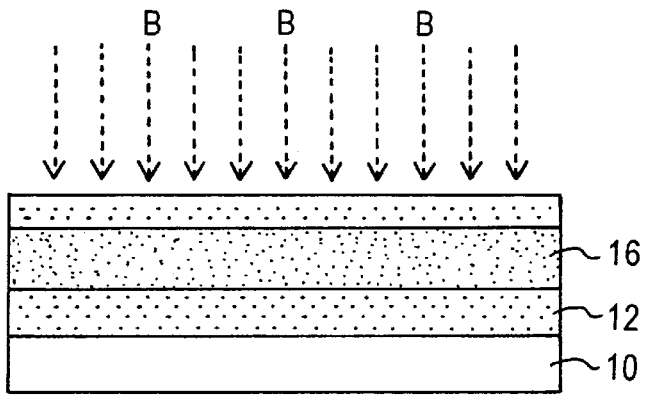

Subsequently, as shown in FIG. 3B, a pulsed laser light beam is impinged on the substrate surface, as shown by arrows B. The impinging pulsed laser light beam melts the retrograde impurity implant 12 and flattens the sharp impurity concentration profile, thereby forming a substantially flat impurity concentration peak 16. In an embodiment of the present invention, a pulsed laser is directed to form the retrograde impurity region 20.

Figure 1:
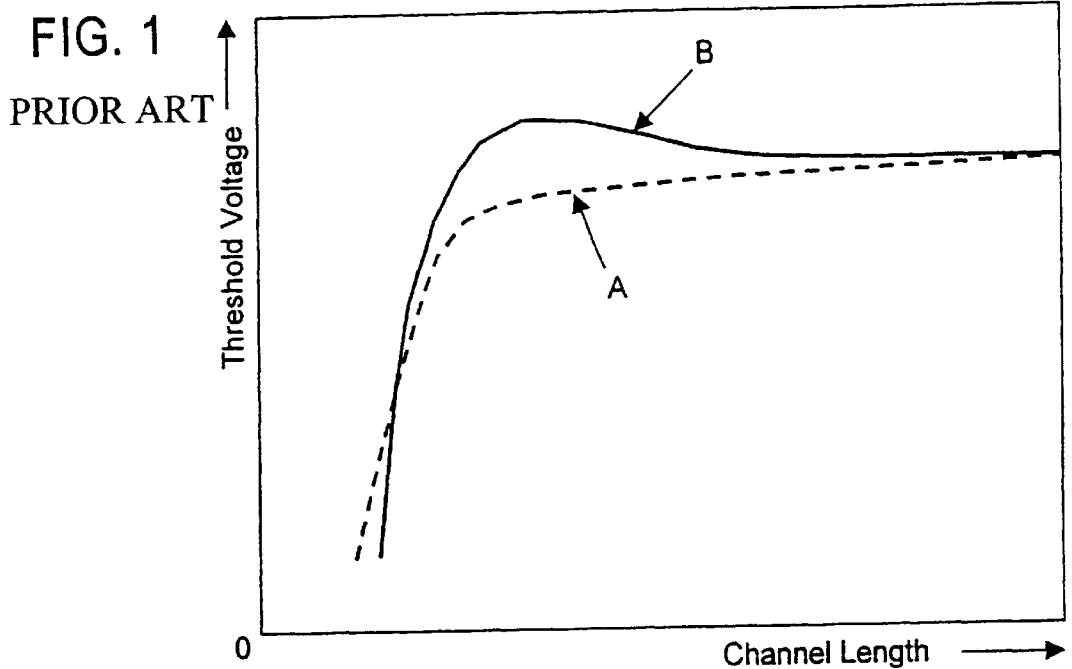
FIG. 1 plots behavior of a threshold voltage as a function of the channel length of a MOSFET device.
Figure 2:
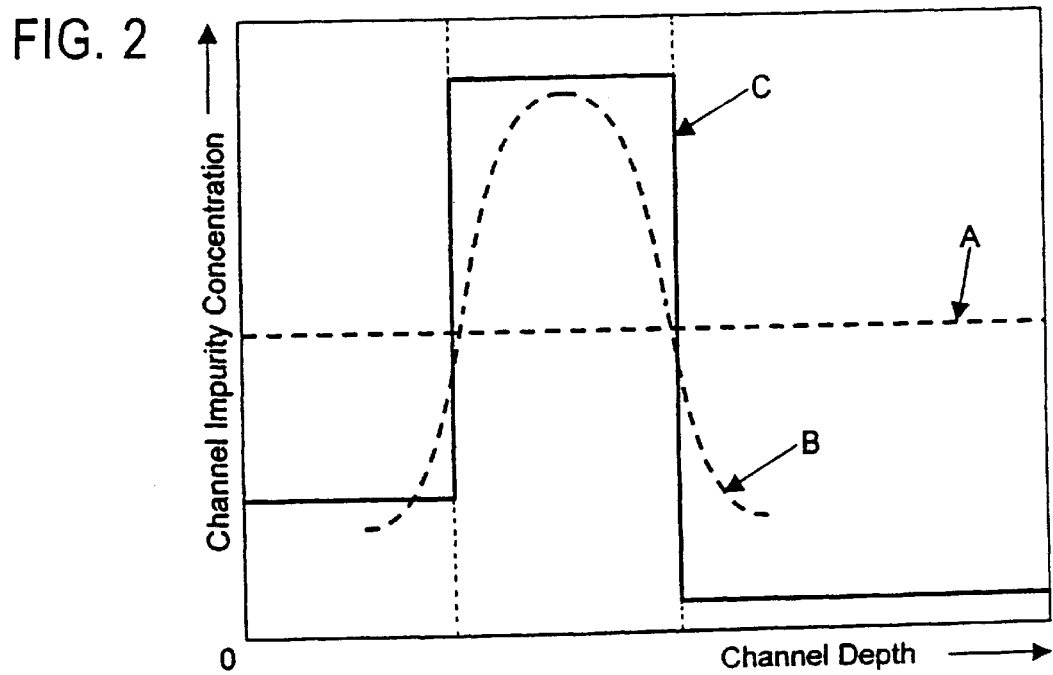
FIG. 2 illustrates channel impurity profiles in accordance with prior art methods and the present invention.
Figure 3C:
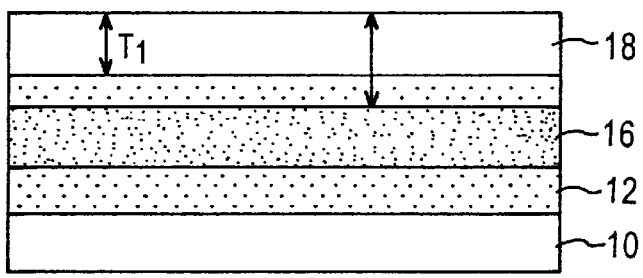

Subsequently, as shown in FIG. 3C, a semiconductor layer 18 is formed on the main surface of the substrate 10 including the retrograde impurity implant 12. The thickness of the semiconductor layer 18 is controlled to a predetermined thickness T1, to localize the retrograde impurity implant 12 at a predetermined depth from the ultimate surface of the substrate after forming the semiconductor layer 18. In an embodiment of the present invention, the semiconductor layer 18 is formed by growing, e.g., by low pressure chemical vapor deposition, a silicon epitaxial layer, containing the same conductive type impurity to the retrograde impurity implant 12. The silicon epitaxial layer has a lower impurity concentration than that of the flat impurity concentration peak 16. An example of an optimized retrograde channel profile according to the present invention is shown by line C in FIG. 2. Accordingly, a super-steep retrograde channel profile, of which the impurity concentration peak is flat is efficiently localized at a predetermined depth, is achieved by controlling the thickness of the semiconductor layer 30.

Figure 4A:
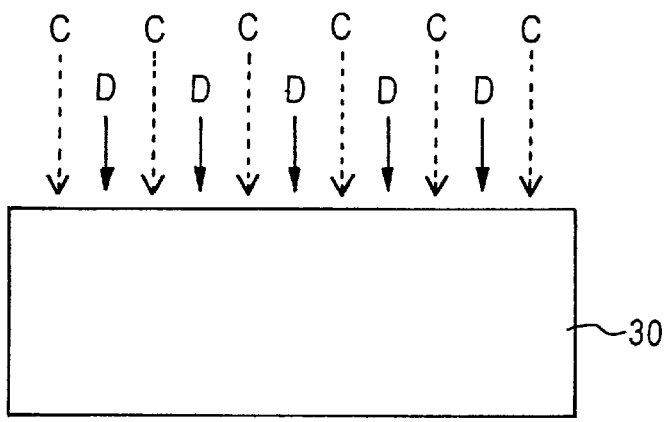
FIG. 4A to FIG. 4D illustrate sequential phase of a method according to another embodiment of the present invention, similar features being denoted by similar reference numerals.
Figure 4B:
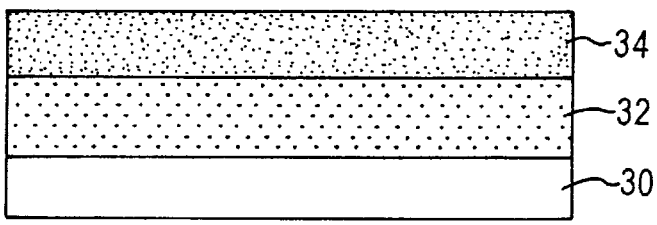

According to another embodiment of the present invention, a substantially flat impurity concentration peak is formed below the main surface of a semiconductor substrate by a simultaneous laser doping and annealing step. As shown in FIG. 4A, a semiconductor substrate 30 is placed in a vacuum chamber and the main surface of the substrate 30 is exposed to a gas ambient containing a desired impurity. A pulsed or continuous wave form laser light beam, as shown by arrows C, is impinged onto the substrate 50, and the impurity atoms contained in the gas ambient driven, as shown by arrows D, by the impinging laser light beam into the substrate 50. The impinging laser light beam causes doping of the substrate 30 with the impurity atoms from the gas ambient and melts the substrate 30, thereby forming an impurity implant 32 of the laser-driven atoms having a substantially flat impurity concentration peak 34 below the main surface of the substrate 30. In an embodiment of the present invention, a laser light beam is directed ions contained in the gas ambient and to form the impurity implant 32 having the substantially flat impurity concentration peak 34.

Figure 4C:
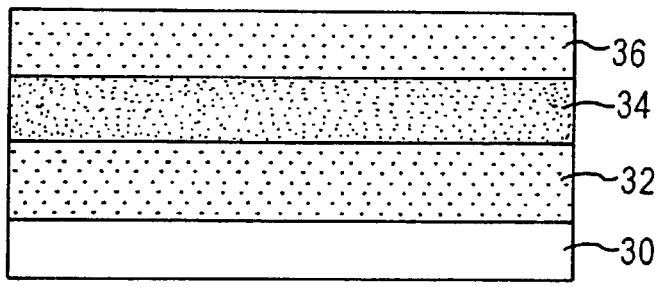

Subsequently, as shown in FIG. 4C, a semiconductor layer 36 is formed on the surface of the impurity implant 32. The thickness of the semiconductor layer 36 is controlled to a predetermined thickness T1 to localize the impurity concentration peak 34 at a predetermined depth from the ultimate surface of the substrate after forming the semiconductor layer 36. In an embodiment of the present invention, the semiconductor layer 38 is formed by growing, e.g., by low pressure chemical vapor deposition, a silicon epitaxial layer, containing the same conductive type impurity to the impurity implant 32. The silicon epitaxial layer has a lower impurity concentration than that of the flat impurity concentration peak 34.

Figure 3D:
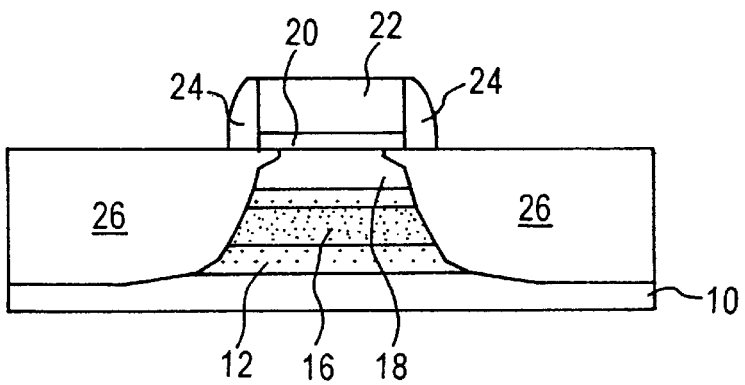
Figure 4D:
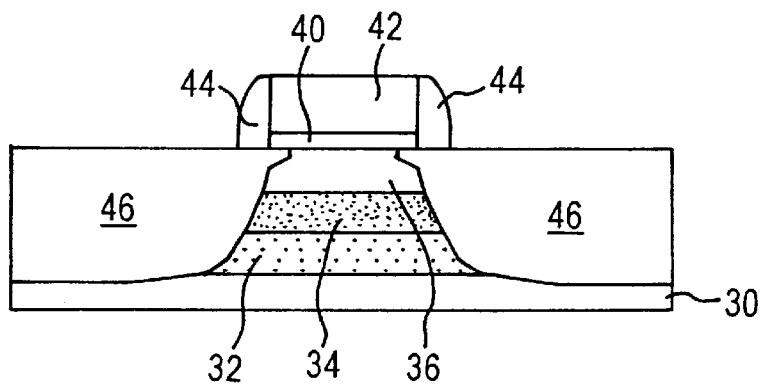

As shown in FIG. 3D and FIG. 4D, embodiments of the present invention further comprise: forming a gate electrode 22, 42 on the surface of the semiconductor layer 18, 30 with a gate dielectric 20, 40 therebetween; ion implanting impurity atoms of the second conductive type, e.g., an N-type impurity, e.g., phosphorus, for an N-type device, to form source and drain regions 26, 46; and forming sidewall spacers 24, 44 on the side surfaces of the gate dielectric 20, 40 and gate electric 22, 42.

Accordingly, the present invention enables the manufacture of a semiconductor device exhibiting reduced susceptibility to "RSCE" by forming a retrograde channel profile and its impurity concentration peak at desired depths. The present invention also provides improved methodology with greater flexibility in tailoring an optimized retrograde impurity profile having an impurity concentration peak at a predetermined depth below the ultimate surface of the substrate after forming the epitaxial layer.

Given the guidance of the present disclosure and disclosed objectives, the optimum dopant, implantation dosage and energy, impurity dosage, thickness, time, laser energy fluence, and pulse frequency can be easily determined in a particular situation.

Embodiments of the present invention involve the use of conventional materials and methodologies to form various components of a transistor and semiconductor device. In the previous description, numerous specific details are set forth such as specific material, structure, chemicals, process, etc., in order to provide a thorough understanding, of the present invention. However, it should be recognized that the present invention can be practiced without resorting to the details specifically set forth. In other instances, well known processing structures have not been described in detail, in order not to unnecessarily obscure the present invention.

Only the preferred embodiment of the present invention and a few examples of its versatility are shown and described in the present disclosure. It is to be understood that the present invention is capable of use in various other combinations and environments and is capable of changes or modifications within the scope of the inventive concept as expresses herein.

What is claimed is:

1. A method of manufacturing a semiconductor device, the method comprising the sequential steps of:

forming a retrograde impurity, implant of a first conductive type in a surface portion of a semiconductor substrate, wherein the retrograde impurity implant has an impurity concentration profile increasing from a main surface of the substrate to an impurity concentration peak at a first depth below the main surface of the substrate;

laser annealing to melt a portion of the substrate and to flatten the impurity concentration peak of the retrograde impurity implant, thereby forming the retrograde impurity implant having a substantially flat impurity concentration peak at a second depth below the main surface of the substrate; and forming a semiconductor layer at a predetermined thickness on the main surface of substrate to controllably localize the flat impurity concentration peak at a predetermined depth below an upper surface of the semiconductor layer.

2. The method according to claim 1, comprising the step of ion implanting an impurity of the first conductive type into the surface portion of the substrate to form the retrograde impurity implant.

3. The method according to claim 2, wherein the impurity of the first conductive type is at least one of boron, arsenic, phosphorus, indium, or antimony.

4. The method according to claim 1, comprising controlling the thickness of the semiconductor layer to control the depth of the substantially flat impurity concentration below the upper surface of the semiconductor layer.

5. The method according to claim 4, comprising forming an epitaxial layer on the main surface of the substrate to form the semiconductor layer.

6. The method according to claim 5, comprising depositing the epitaxial layer by chemical vapor deposition.

7. A method of manufacturing a semiconductor device, the method comprising the sequential steps of:

simultaneously laser doping and annealing a portion of a main surface of a semiconductor substrate to form a substantially flat impurity concentration peak below the main surface of the substrate; and forming a semiconductor layer at a predetermined thickness on the main surface of the substrate to controllably localize the substantially flat impurity concentration peak at a predetermined depth below an upper surface of the semiconductor layer.

8. The method according to claim 7, comprising exposing the main surface to a laser light beam in the presence of an impurity of first conductive type, thereby doping and annealing the main surface of the substrate to form the substantially flat impurity concentration peak below the main surface of the substrate.

9. The method according to claim 8, wherein the impurity of the first conductive type is at least one of boron, arsenic, phosphorus, indium, or antimony.

10. The method according to claim 7, comprising controlling the thickness of the semiconductor layer to control the depth of the substantially flat impurity concentration peak below the upper surface of the semiconductor layer.

11. The method according to claim 7, comprising forming an epitaxial layer on the main surface of the substrate to form the semiconductor layer.

12. The method according to claim 11, comprising depositing the epitaxial layer by chemical vapor deposition.

* * * * *